(12) United States Patent
Miura et al.

(10) Patent No.: US 7,978,443 B2
(45) Date of Patent: Jul. 12, 2011

(54) TUNNEL MAGNETORESISTIVE EFFECT ELEMENT HAVING A TUNNEL BARRIER LAYER OF A CRYSTALLINE INSULATION MATERIAL AND MANUFACTURING METHOD OF TUNNEL MAGNETORESISTIVE EFFECT ELEMENT

(75) Inventors: Satoshi Miura, Tokyo (JP); Takumi Yanagisawa, Tokyo (JP)

(73) Assignee: TDK Corporation, Tokyo (JP)

( * ) Notice: Subject to any disclaimer, the term of this patent is extended or adjusted under 35 U.S.C. 154(b) by 852 days.

(21) Appl. No.: 11/944,731

(22) Filed: Nov. 26, 2007

(65) Prior Publication Data

US 2008/0124581 A1 May 29, 2008

(30) Foreign Application Priority Data

Nov. 27, 2006 (JP) .................................. 2006-318275

(51) Int. Cl.
*G11B 5/39* (2006.01)
(52) U.S. Cl. .................................................. 360/324.2
(58) Field of Classification Search ............... 360/324.2, 360/324.1, 324.11, 324.12
See application file for complete search history.

(56) References Cited

U.S. PATENT DOCUMENTS

| 6,710,987 B2 | 3/2004 | Sun et al. | |
|---|---|---|---|
| 7,663,848 B1 * | 2/2010 | Huai et al. | 360/324.2 |
| 7,715,156 B2 * | 5/2010 | Hirata et al. | 360/324.2 |
| 7,751,156 B2 * | 7/2010 | Mauri et al. | 360/324.2 |
| 2006/0056115 A1 | 3/2006 | Djayaprawira et al. | |
| 2007/0165338 A1 * | 7/2007 | Kamai et al. | 360/324.2 |

FOREIGN PATENT DOCUMENTS

| JP | A-2001-7420 | 1/2001 |
|---|---|---|
| JP | A-2001-189503 | 7/2001 |
| JP | A-2003-124541 | 4/2003 |
| JP | A-2006-80116 | 3/2006 |
| JP | A-2008-103661 | 5/2008 |
| WO | WO 2006/023018 A2 | 3/2006 |

* cited by examiner

*Primary Examiner* — Jefferson Evans
(74) *Attorney, Agent, or Firm* — Oliff & Berridge, PLC

(57) ABSTRACT

A TMR element includes a lower magnetic layer, an upper magnetic layer, and a tunnel barrier layer of crystalline insulation material sandwiched between the lower magnetic layer and the upper magnetic layer. The lower magnetic layer includes a first magnetic layer and a second magnetic layer sandwiched between the first magnetic layer and the tunnel barrier layer. The second magnetic layer is formed from a magnetic material containing at least one of Fe, Co and Ni.

25 Claims, 10 Drawing Sheets

TUNNEL MAGNETORESISTIVE EFFECT ELEMENT HAVING A TUNNEL BARRIER LAYER OF A CRYSTALLINE INSULATION MATERIAL AND MANUFACTURING METHOD OF TUNNEL MAGNETORESISTIVE EFFECT ELEMENT

PRIORITY CLAIM

This application claims priority from Japanese patent application No. 2006-318275, filed on Nov. 27, 2006, which is incorporated herein by reference.

BACKGROUND OF THE INVENTION

1. Field of the Invention

The present invention relates to a tunnel magnetoresistive (TMR) effect element, to a thin-film magnetic head with the TMR element, to a magnetic head assembly with the thin-film magnetic head, to a magnetic disk drive apparatus with the magnetic head assembly, to a magnetic memory with the TMR element, and to a manufacturing method of a TMR element.

2. Description of the Related Art

The TMR element has a ferromagnetic tunnel junction structure in which a tunnel barrier layer is sandwiched between a magnetization-fixed layer and a magnetization-free layer. The magnetization-fixed layer has a pinned layer and an anti-ferromagnetic layer (pinning layer). In the magnetization-fixed layer, therefore, the magnetization of the pinned layer is hard to move in response to an external magnetic field due to exchange-coupling field with the anti-ferromagnetic layer. Contrary to this, in the magnetization-free layer, the magnetization is easy to change in response to the external magnetic field. With such a structure, the external magnetic field causes a relative orientation of the magnetization directions of the magnetization-fixed layer and the magnetization-free layer to change. The change of the relative magnetization orientation causes the probability of electrons tunneling through the tunnel barrier layer to vary, to thereby change resistance of the element. Such a TMR element is usable as a read head element that detects intensity of magnetic field from a recording medium, and also applicable to a cell of magnetic RAM (MRAM) as a magnetic memory.

As material of the tunnel barrier layer in the TMR element, amorphous oxide of aluminum (Al) or titanium (Ti) has been generally used as disclosed for example in U.S. Pat. No. 6,710,987.

Recently, there has been proposed a TMR element using a tunnel barrier layer made of crystalline magnesium (Mg) oxide. Such TMR element using the tunnel barrier layer of magnesium oxide can have a higher MR ratio (magnetoresistive change ratio) compared with the TMR element with a tunnel barrier layer of Al oxide or Ti oxide as disclosed in U.S. Patent Publication No. 2006/0056115A1.

The tunnel barrier layer of crystalline oxide such as Mg oxide tends to become the orientation of (001) if it is deposited on an amorphous layer, that is, if its under magnetic layer is made of an amorphous material such as a cobalt iron boron (CoFeB). The orientation of (001) in the tunnel barrier layer of crystalline oxide causes coherent spin-polarized tunneling or single-electron spin-polarized tunneling to increase the MR ratio higher than that when using a tunnel barrier layer of amorphous oxide such as Al oxide.

It is known in this art that an MR ratio of a TMR element using a tunnel barrier layer of crystalline oxide more increases when the CoFeB layer is crystallized by performing an anneal process after a deposition process of these layers. However, in order to crystallize an amorphous CoFeB layer, it is necessary to increase the annealing temperature to an extremely high temperature such as 300° C. or more. Performing of such high temperature annealing process during the manufacturing process of the thin-film magnetic head is not desirable because the magnetization conditions and also the crystalline structure in the shield layers and other layers may change.

SUMMARY OF THE INVENTION

It is therefore an object of the present invention to provide a TMR element, a thin-film magnetic head with the TMR element, a magnetic head assembly with the thin-film magnetic head, a magnetic disk drive apparatus with the magnetic head assembly, a magnetic memory with the TMR element, and a manufacturing method of a TMR element, whereby if a tunnel barrier layer of a crystalline insulation material is used, it is possible to obtain TMR elements having a high MR ratio without performing a high-temperature annealing procedure.

According to the invention, a TMR element includes a lower magnetic layer, an upper magnetic layer, and a tunnel barrier layer of a crystalline insulation material sandwiched between the lower magnetic layer and the upper magnetic layer. The lower magnetic layer includes a first magnetic layer and a second magnetic layer sandwiched between the first magnetic layer and the tunnel barrier layer. The second magnetic layer is formed from a magnetic material containing at least one of iron (Fe), cobalt (Co) and nickel (Ni).

In case that the tunnel barrier layer is made of a crystalline insulation material, a lower magnetic layer under the tunnel barrier layer is configured as a first magnetic layer and a second magnetic layer stacked on the first magnetic layer and formed from a magnetic material containing at least one of Fe, Co and Ni. Due to a two-layered structure of the lower magnetic layer of the first magnetic layer and the second magnetic layer, it is possible to easily crystallize this lower magnetic layer without performing an annealing process at a high temperature of about 350° C. The reason of this is as follows. The first magnetic layer is amorphous state just after the deposition. The second magnetic layer stacked on the first magnetic layer is amorphous state or microcrystalline state if it has a thickness equal to or less than a certain value just after the deposition. Since the second magnetic layer is made of an easily crystallized magnetic material and the crystalline tunnel barrier layer is deposited thereon, this second magnetic layer can be easily crystallized by a low-temperature annealing process without performing a high-temperature annealing process resulting an MR ratio to increase. Along with the crystallization of the second magnetic layer, a part of or the entire first magnetic layer is crystallized. Namely, because the lower magnetic layer has a two-layered structure and there exists the second magnetic layer, annealing temperature for crystallizing the lower magnetic layer can be lowered. Even at the annealing temperature at 300° C. or less, a sufficiently high MR ratio can be attained.

It is preferred that the second magnetic layer is formed from a magnetic material, a part of or all of which is crystalline.

It is also preferred that the first magnetic layer is formed from a magnetic material, a part of or all of which is crystalline. In other words, preferably, the first magnetic layer is in amorphous state at least at the deposition and a part of or all of which is crystalline after annealing process.

It is further preferred that the first magnetic layer is formed from a magnetic material that contains as a main component at least one of Fe, Co and Ni, and further contains at least one of boron (B), zirconium (Zr), hafnium (Hf), silicon (Si), tantalum (Ta), molybdenum (Mo), niobium (Nb), palladium (Pd) and titanium (Ti).

It is still further preferred that the first magnetic layer has a thickness of 0.7 nm or more, more preferably, a thickness of 1.0 nm or more.

It is further preferred that the second magnetic layer has a thickness of 0.2 to 2.9 nm, more preferably, a thickness of 0.4 to 1.8 nm.

It is preferred that the tunnel barrier layer is formed from a crystalline insulation material of Mg oxide.

It is also preferred that the lower magnetic layer is a magnetization-fixed layer comprising an anti-ferromagnetic layer, an outer pinned layer stacked on the anti-ferromagnetic layer, a nonmagnetic intermediate layer stacked on the outer pinned layer, and an inner pinned layer consisting of the first magnetic layer and the second magnetic layer, stacked on the nonmagnetic intermediate layer, and that the upper magnetic layer is a magnetization-free layer. In this case, a saturated magnetization per unit area of the outer pinned layer is preferably larger than a saturated magnetization per unit area of the inner pinned layer.

According to the present invention, also, a magnetic memory with the aforementioned TMR element, a thin-film magnetic head with the aforementioned TMR element, and a magnetic head assembly having the thin-film magnetic head, and a support member for supporting the thin-film magnetic head are provided. Here, the magnetic head assembly means an assembly mechanically and electrically assembling a thin-film magnetic head or a magnetic head slider having a write head element and a read head element with its support member. More concretely, an assembly of a magnetic head slider and a suspension is in general called as a head gimbal assembly (HGA), an assembly of a magnetic head slider, a suspension and a support arm for supporting the suspension is in general called as a head arm assembly (HAA), and an assembly stacking a plurality of HAAs is in general called as a head stack assembly (HSA).

According to the present invention, further, a magnetic disk drive apparatus having at least one magnetic disk and at least one aforementioned magnetic head assembly is provided.

According to the present invention, still further, a manufacturing method of a TMR element includes a step of forming a magnetization-fixed layer, a step of forming a tunnel barrier layer on the magnetization-fixed layer, and a step of forming a magnetization-free layer on the tunnel barrier layer. The forming step of the magnetization-fixed layer includes stacking sequentially a first magnetic layer and a second magnetic layer formed from a magnetic material containing at least one of Fe, Co and Ni, the forming step of the tunnel barrier layer includes stacking on the second magnetic layer the tunnel barrier layer of a crystalline insulation material.

Due to a two-layered structure of the lower magnetic layer of the first magnetic layer and the second magnetic layer, it is possible to easily crystallize this lower magnetic layer without performing an annealing process at a high temperature of about 350° C. The reason of this is as follows. The first magnetic layer is amorphous state just after the deposition. The second magnetic layer stacked on the first magnetic layer is amorphous state or microcrystalline state if it has a thickness equal to or less than a certain value just after the deposition. Since the second magnetic layer is made of an easily crystallized magnetic material and the crystalline tunnel barrier layer is deposited thereon, this second magnetic layer can be easily crystallized by a low-temperature annealing process without performing a high-temperature annealing process resulting an MR ratio to increase. Along with the crystallization of the second magnetic layer, a part of or the entire first magnetic layer is crystallized. Namely, because the lower magnetic layer has a two-layered structure and there exists the second magnetic layer, annealing temperature for crystallizing the lower magnetic layer can be lowered. Even at the annealing temperature at 300° C. or less, a sufficiently high MR ratio can be attained.

It is preferred that the stacking of the second magnetic layer includes depositing a magnetic material that is easily crystallized.

It is also preferred that the stacking of the first magnetic layer includes depositing a magnetic material that is amorphous at least at deposition. If the first magnetic layer is deposited as a magnetic material that is amorphous at least at deposition, the second magnetic layer becomes amorphous state or microcrystalline state under the conditions that it has a thickness equal to or less than a certain value just after the deposition. Thus, the crystalline tunnel barrier layer deposited thereon can be grown under energetically stable crystal orientation. Also, due to the flat surface of the first magnetic layer, a flatness of an upper surface of the second magnetic layer deposited thereon improves.

It is further preferred that the method further includes a step of performing a low-temperature annealing after the forming of the tunnel barrier layer in order to crystallize a part of or all of the first magnetic layer and the second magnetic layer.

It is still further preferred that the stacking of the first magnetic layer includes depositing a magnetic material that contains as a main component at least one of Fe, Co and Ni, and further contains at least one of B, Zr, Hf, Si, Ta, Mo, Nb, Pd and Ti.

It is further preferred that the stacking of the first magnetic layer includes depositing the first magnetic layer to have a thickness of 0.7 nm or more, more preferably, a thickness of 1.0 nm or more.

It is still further preferred that the stacking of the second magnetic layer comprises depositing the second magnetic layer to have a thickness of 0.2 to 2.9 nm, more preferably, a thickness of 0.4 to 1.8 nm.

It is further preferred that the stacking of the tunnel barrier layer includes depositing a crystalline insulation material of Mg oxide.

It is further preferred that the forming step of the magnetization-fixed layer includes stacking sequentially an anti-ferromagnetic layer, an outer pinned layer, a nonmagnetic intermediate layer and an inner pinned layer consisting of the first magnetic layer and the second magnetic layer, in this order. In this case, it is more preferred that the stacking of the outer pinned layer and the inner pinned layer is performed such that a saturated magnetization per unit area of the outer pinned layer is larger than a saturated magnetization per unit area of the inner pinned layer.

Further objects and advantages of the present invention will be apparent from the following description of the preferred embodiments of the invention as illustrated in the accompanying drawings.

DESCRIPTION OF THE PREFERRED EMBODIMENTS

Figure 1:
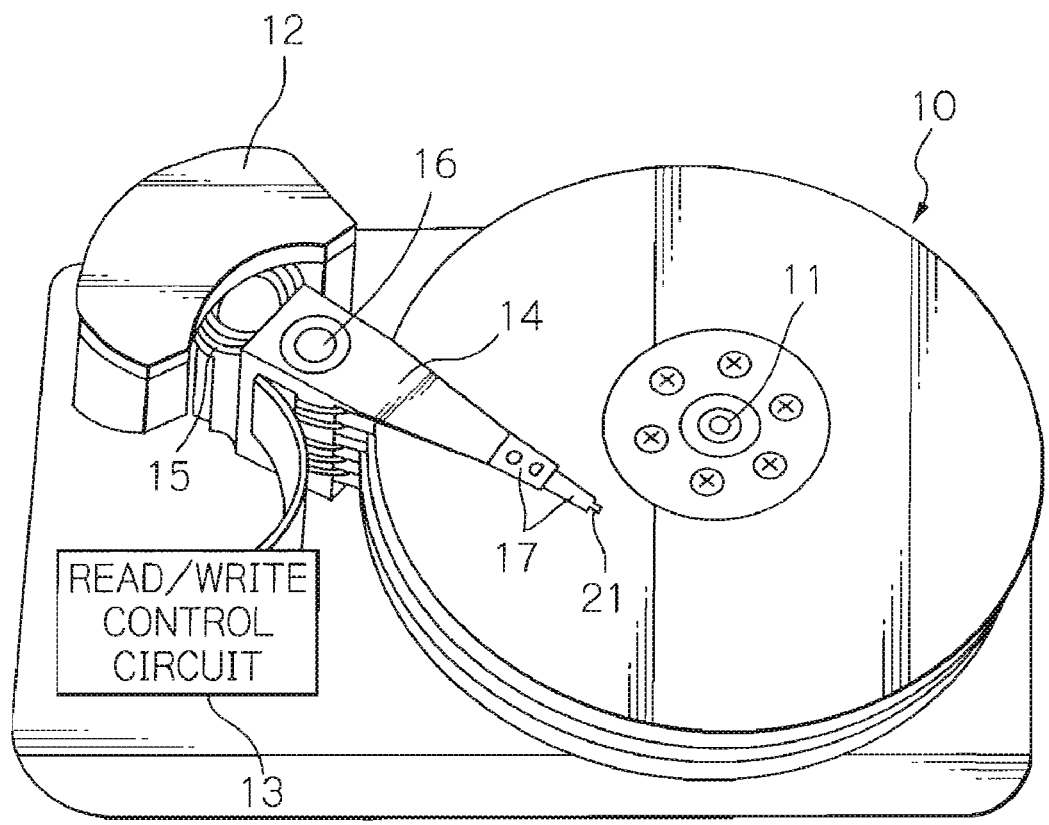
FIG. 1 is a perspective view schematically illustrating the main structure of a magnetic disk drive apparatus as an embodiment according to the present invention.
Figure 2:
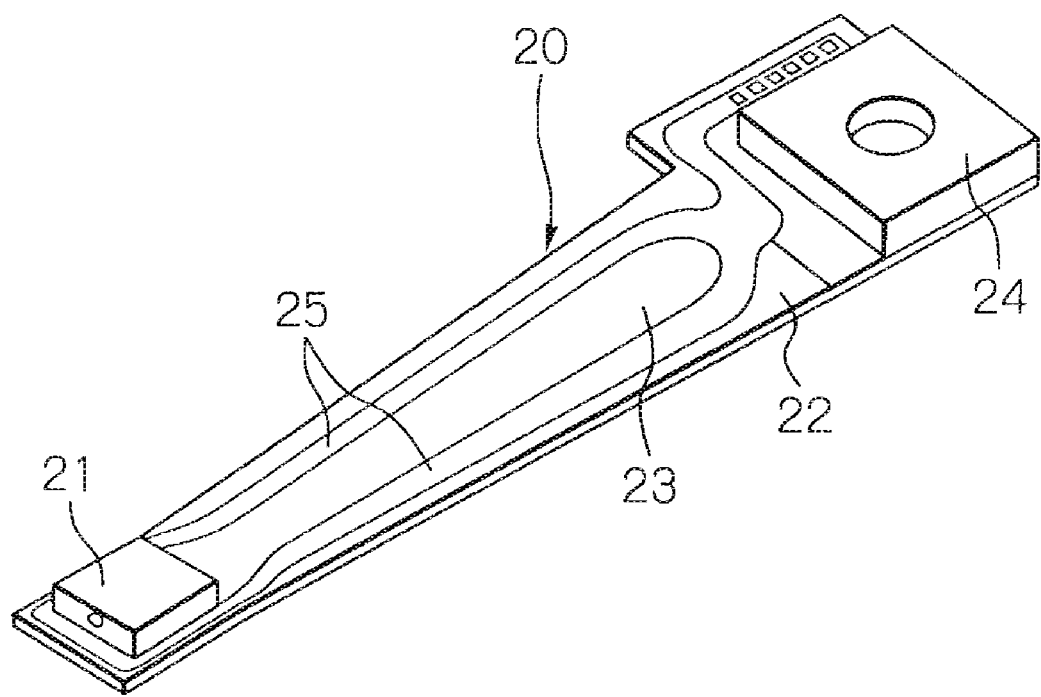
FIG. 2 is a perspective view illustrating an example of the structure of a head gimbal assembly (HGA) shown in FIG. 1.
Figure 3:
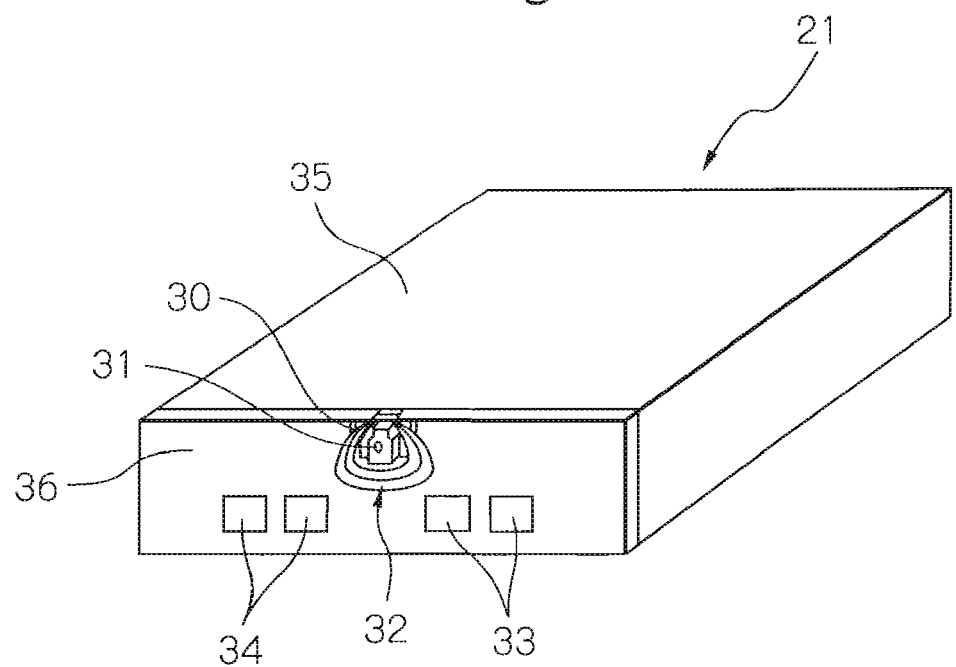
FIG. 3 is a perspective view illustrating a composite thin-film magnetic head mounted at the end of the HGA of FIG. 2.
Figure 4:
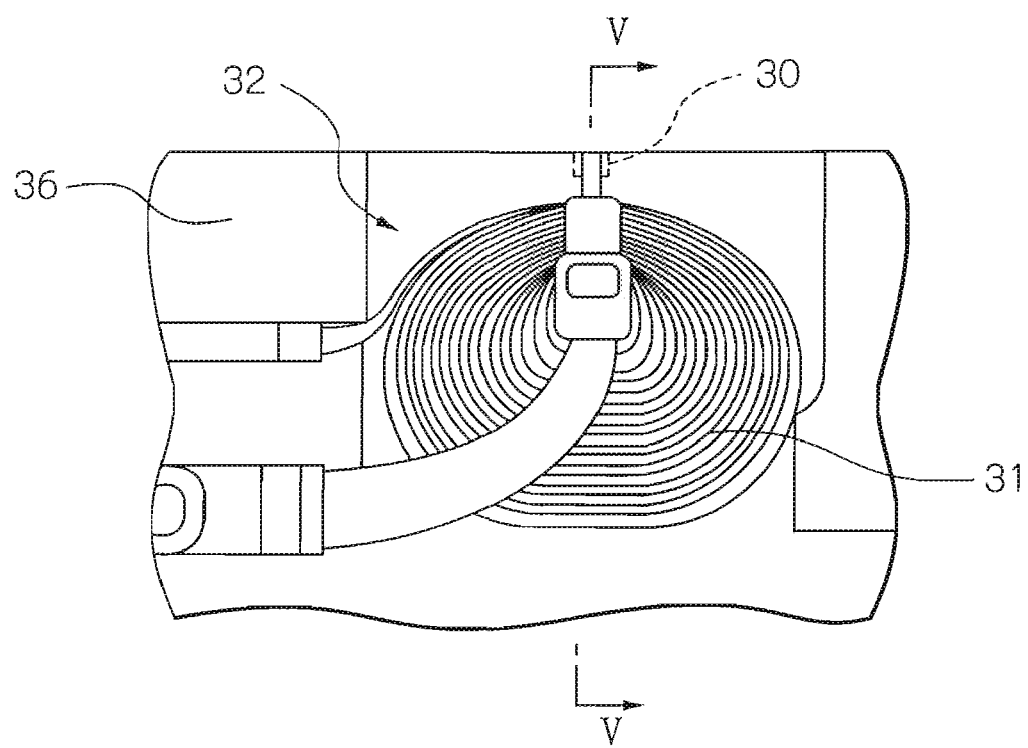
FIG. 4 is a plane view illustrating a magnetic head part of the composite thin-film magnetic head of FIG. 3, when viewed from an element forming surface side of a slider substrate.

FIG. 1 schematically illustrates the main structure of a magnetic disk drive apparatus according to an embodiment of the present invention. FIG. 2 illustrates an example of the structure of an HGA of FIG. 1. FIG. 3 illustrates the composite thin-film magnetic head mounted at the end of the HGA of FIG. 2. FIG. 4 illustrates the magnetic head element part of the composite thin-film magnetic head of FIG. 3, when viewed from an element forming surface side of a slider substrate.

In FIG. 1, a reference numeral 10 denotes a plurality of magnetic disks that rotates about a rotary axis of a spindle motor 11, 12 denotes an assembly carriage device for positioning the composite thin-film magnetic head or magnetic head slider on the track, and 13 denotes a read/write control circuit for controlling the read/write operation of the thin-film magnetic head, respectively.

The assembly carriage device 12 includes a plurality of drive arms 14. The drive arms 14 are swingable about a pivot-bearing axis 16 by a voice coil motor (VCM) 15, and are stacked in a direction along this axis 16. Each of the drive arms 14 has an HGA 17 mounted at the end thereof. The HGA 17 includes a magnetic head slider 12 facing the surface of each magnetic disk 10. In modifications, the magnetic disk drive apparatus may include only a single magnetic disk 10, drive arm 14 and HGA 17.

As shown in FIG. 2, in the HGA, the magnetic head slider 21 is fixed onto the end of a suspension 20. The magnetic head slider 21 has a TMR read head element and an inductive write head element. Further, in the HGA, a terminal electrode of the magnetic head slider 21 is electrically connected to an end of a wiring member 25.

The suspension 20 includes mainly a load beam 22, a flexure 23, a base plate 24 and the wiring member 25. The load beam 22 generates a load to be applied to the magnetic head slider 21. The flexure 23 having elasticity is fixed onto and supported by the load beam 22. The base plate 24 is arranged on the base of the load beam 22. The wiring member 25 is arranged on the flexure 23 and the load beam 22, and includes lead conductors and connection pads electrically connected to both ends of the lead conductors.

It is obvious that the structure of the suspension according to the present invention is not limited to the above.

As shown in FIGS. 3 and 4, the magnetic head slider 21 of this embodiment includes a composite thin-film magnetic head 32 and four signal terminal electrodes 33 and 34, on an element formed surface 36 that is one side surface when an air bearing surface (ABS) 35 of the magnetic head slider serves as the bottom surface. The composite thin-film magnetic head 32 includes a TMR read head element 30 and an inductive write head element 31 that are mutually stacked. The four signal terminal electrodes 33 and 34 are connected to the TMR read head element 30 and the inductive write head element 31, respectively. The positions of these terminal electrodes are not limited to those shown in FIG. 3.

Figure 5:
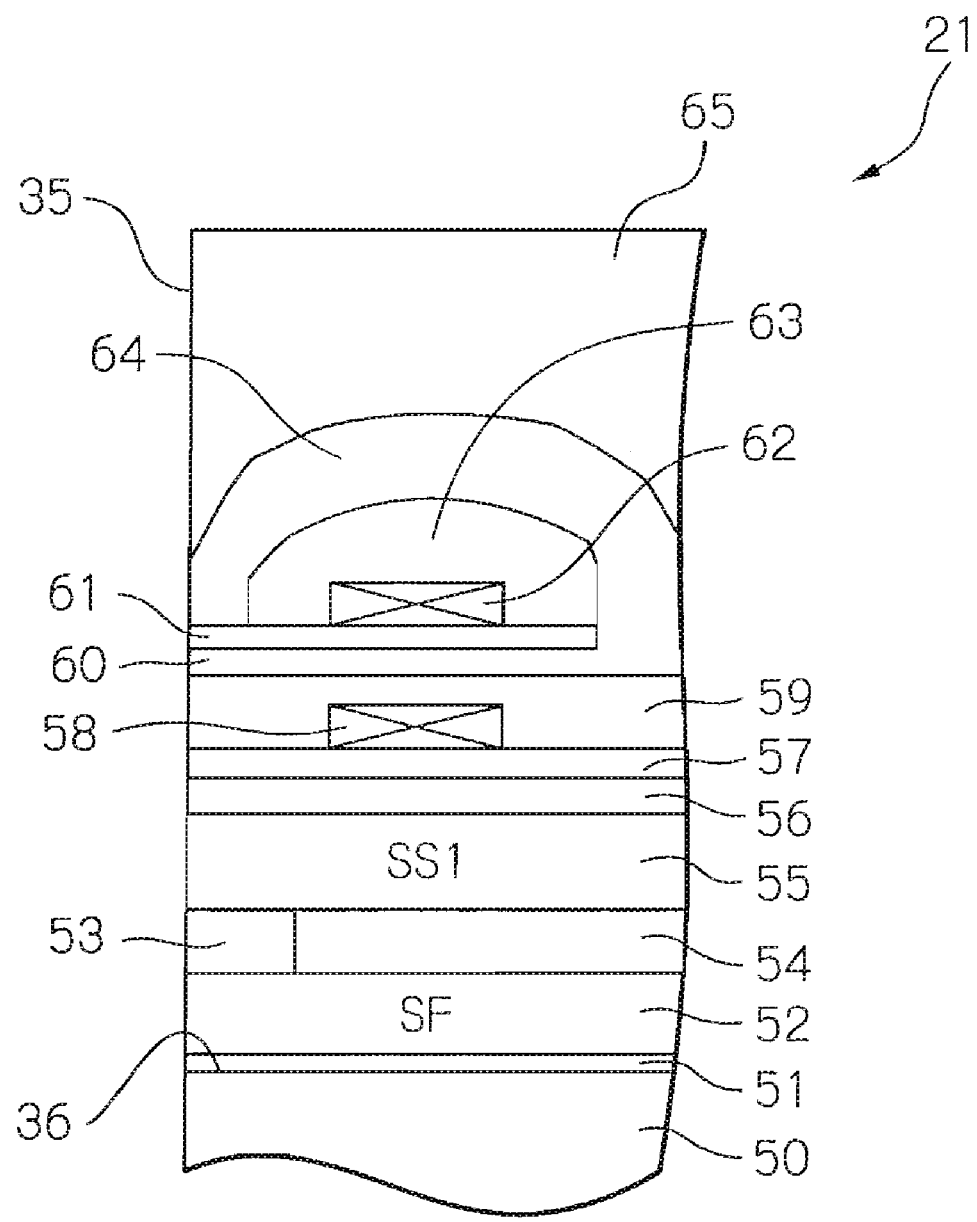
FIG. 5 is a central cross sectional view schematically illustrating the structure of the composite thin-film magnetic head of FIG. 3.

FIG. 5 schematically illustrates the structure of the composite thin-film magnetic head according to this embodiment. This figure shows a V-V line cross-section of FIG. 4. In this embodiment, the inductive write head element consists of a write head element with a perpendicular magnetic recording structure. However, the inductive write head element may be a write head element with a plane or horizontal magnetic recording structure. Also, perpendicular magnetic recording structure inductive write head elements having various structures other than that illustrated in FIG. 5 may be applied.

The ABS 35 facing the surface of the magnetic disk is formed on a slider substrate 50 made of a conductive material, such as AlTiC, $Al_2O_3$—TiC. In operation, the magnetic head slider 21 hydrodynamically flies above the rotating magnetic disk with a predetermined flying height. An under insulation layer 51 is stacked on the element forming surface 36 of the slider substrate 50. This layer 51 is made of an insulating material, such as alumina ($Al_2O_3$) or silicon oxide ($SiO_2$), with a thickness of about 0.05 to 10 μm. A lower electrode layer 52 is stacked on the under insulation layer 51. This layer 52 can serve also as a lower shield layer (SF) made of a metal magnetic material, such as iron aluminum silicon (FeAlSi), nickel iron (NiFe), cobalt iron (CoFe), nickel iron cobalt (NiFeCo), iron nitride (FeN), iron zirconium nitride (FeZrN), iron tantalum nitride (FeTaN), cobalt zirconium niobium (CoZrNb) or cobalt zirconium tantalum (CoZrTa). A TMR multi-layered structure 53 and an insulation layer 54 made of an insulating material, such as $Al_2O_3$ or $SiO_2$ are stacked on the lower electrode layer 52.

The TMR multi-layered structure 53 has multi-layers of a magnetization fixed layer consisting of a pinned layer and a pinning layer made of an anti-ferromagnetic material, a tunnel barrier layer, and a magnetization free layer. It is apparent that various layer structures may be applied to the TMR multi-layered structure 53. A magnetic domain control layer (not shown in FIG. 5) and the like for controlling the magnetic domain of the free layer are formed on the side surfaces of the TMR multi-layered structure 53.

The upper electrode layer 55 made of a metallic magnetic material, such as FeAlSi, NiFe, CoFe, NiFeCo, FeN, FeZrN, FeTaN, CoZrNb, or CoZrTa is formed on the TMR multi-layer 53 and the insulation layer 54. This upper electrode layer 55 serves also as an upper shield layer (SS1).

The TMR read head element is basically composed of the lower electrode layer 52, the TMR multi-layer 53, the insulation layer 54, the upper electrode layer 55 and the magnetic domain control layer. The structure of the TMR read head element will more specifically be described later with reference to FIG. 6.

On the upper electrode layer 55, a nonmagnetic layer 56 for separating the TMR read head element and the inductive write head element thereon is formed. This nonmagnetic layer 56 is made of an insulation material such as $Al_2O_3$, $SiO_2$, aluminum nitride (AlN) or diamond like carbon (DLC), or a metallic material such as Ti, Ta or platinum (Pt).

On the nonmagnetic layer 56, the inductive write head element is formed. This write head element includes an insulation layer 57, a backing coil layer 58, a backing coil insulation layer 59, a main magnetic pole layer 60, an insulation gap layer 61, a write coil layer 62, a write coil insulation layer 63 and an auxiliary magnetic pole layer 64. The insulation layer 57 is made of an insulating material, such as $Al_2O_3$ or $SiO_2$. The backing coil layer 58 is made of a conductive material, such as copper (Cu), etc. The backing coil insulation layer 59 is made, for example, of a heat-cured resist of novolac type. The main magnetic pole layer 60 is formed of a single layer film of a metallic magnetic material, such as FeAlSi, NiFe, CoFe, NiFeCo, FeN, FeZrN, FeTaN, CoZrNb or CoZrTa, or formed of a multi-layer film of any of these materials. The insulation gap layer 61 is made of an insulating material, such as $Al_2O_3$ or $SiO_2$. The write coil layer 62 is made of a conductive material, such as Cu. The insulation layer 63 is made, for example, of a heat-cured resist of novolac type. The auxiliary magnetic pole layer 64 is formed of a single layer film of a metallic magnetic material, such as FeAlSi, NiFe, CoFe, NiFeCo, FeN, FeZrN, FeTaN, CoZrNb or CoZrTa, or formed of a multi-layer film of any of these materials. A protective layer 65 made of $Al_2O_3$ or $SiO_2$, etc. is arranged on the inductive write head element.

Figure 6:
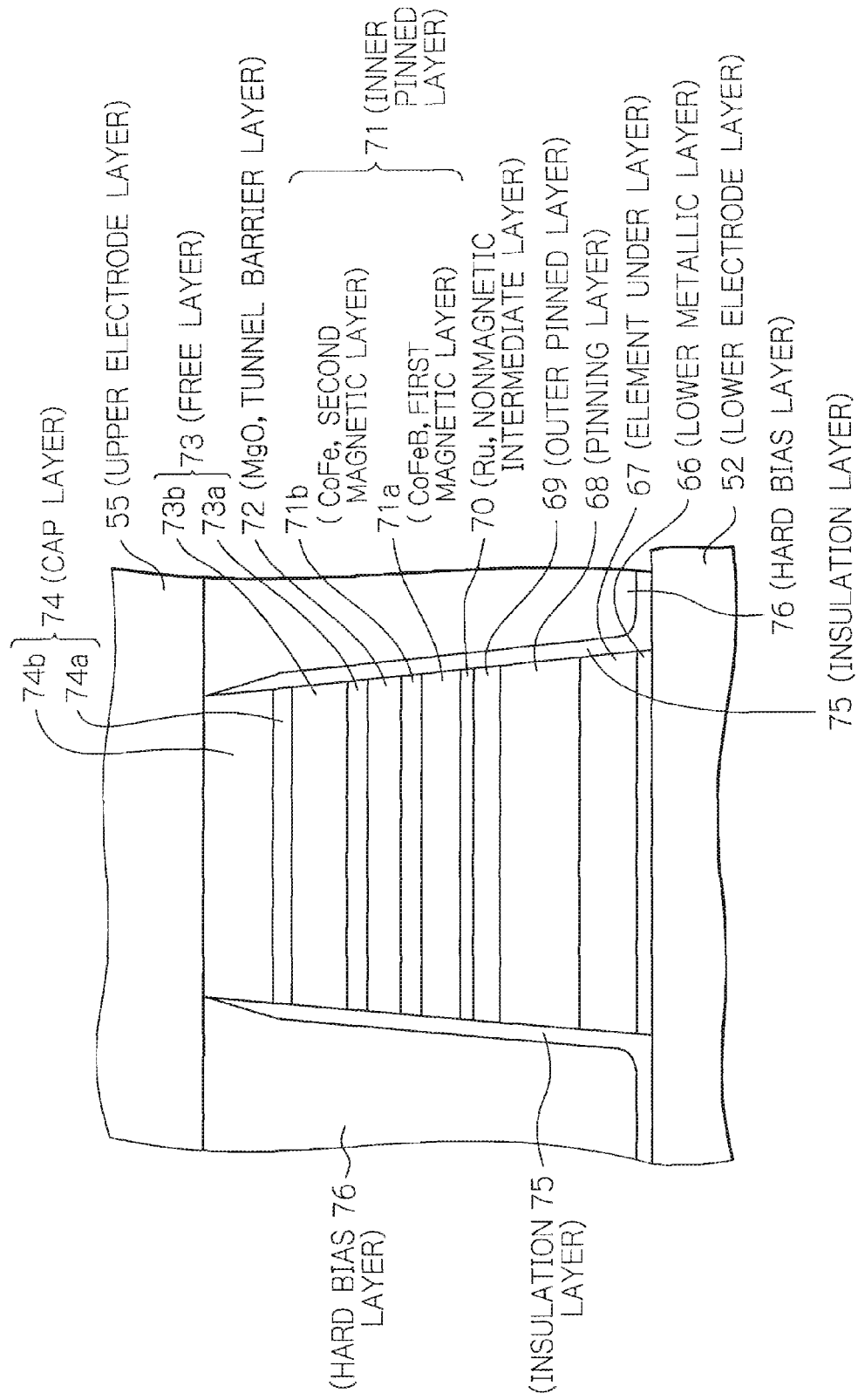
FIG. 6 is a cross sectional view schematically illustrating the structure of a TMR read head element part of the composite thin-film magnetic head of FIG. 3.

FIG. 6 schematically illustrates the structure of the TMR read head element part of the composite thin-film magnetic head. FIG. 6 shows a cross sectional view in a plane parallel to the ABS. In this illustration, for the sake of clarity in the description, names of the layers and exemplary materials of a part of the layers (but not limited to) follow corresponding reference numerals.

A lower metallic layer 66 and an element under-layer 67 are stacked on the lower electrode layer 52 in the order described. The lower metallic layer 66 is made, for example, of Ta with a thickness of approximately 0.5 to 5 nm. The element under-layer 67 is made, for example, of nickel chromium (NiCr), NiFe, nickel iron chromium (NiFeCr) or ruthenium (Ru) with a thickness of approximately 1 to 6 nm. An anti-ferromagnetic layer (pinning layer) 68 made of a manganese (Mn) alloy, such as iridium manganese (IrMn), platinum manganese (PtMn), palladium platinum manganese (PdPtMn), iron manganese (FeMn), nickel manganese (NiMn), ruthenium rhodium manganese (RuRhMn), rhodium manganese (RhMn) or chromium manganese platinum (CrMnPt) with a thickness of about 5 to 15 nm, preferably approximately 7 nm is stacked on the element under-layer 67.

A synthetic pinned layer is stacked on the anti-ferromagnetic layer 68. This pinned layer consists of an outer pinned layer 69, a nonmagnetic intermediate layer 70 and an inner pinned layer 71 sequentially stacked. The outer pinned layer 69 is made, for example, of CoFe with a thickness of about 3.0 nm. The nonmagnetic intermediate layer 70 is made, for example, of Ru with a thickness of about 0.8 nm. In the synthetic pinned layer, the magnetic moment of the outer pinned layer 69 and the inner pinned layer 71 is mutually cancelled so as to suppress the leakage magnetic field as a whole, and the magnetization direction of the inner pinned layer 71 is securely fixed as a result of anti-ferromagnetic exchange coupling with the outer pinned layer 69. The magnetization direction of the outer pinned layer 69 is fixed due to anti-ferromagnetic exchange coupling with the anti-ferromagnetic layer 68.

The inner pinned layer 71 has a two-layered structure consisting of a first magnetic layer 71a and a second magnetic layer 71b stacked in this order. The first magnetic layer 71a is made, for example, of CoFeB with a thickness of about 0.7 nm or more, preferably about 1.0 nm or more. The second magnetic layer 71b is made, for example, of crystalline CoFe or Co with a thickness of about 0.2 to 2.6 nm, preferably about 0.8 to 2.2 nm.

The first magnetic layer 71a may be made of, other than CoFeB, a magnetic material having a main component of at least one of Fe, Co and Ni and containing at least one of B, Zr, Hf, Si, Ta, Mo, Nb, Pd and Ti. The second magnetic layer 71b may be made of, other than CoFe, a magnetic material containing at least one of Fe, Co and Ni. The first magnetic layer 71a may be formed by a single layer structure as aforementioned, or formed by a multi-layered structure such as a two-layered structure or a three-layered structure. In the latter case, the first magnetic layer 71a may be formed of a two-layered structure of CoFe/CoFeB stacked in this order from the bottom or a three-layered structure of CoFeB/CoFe/CoFeB stacked in this order from the bottom.

A tunnel barrier layer 72 is stacked on the inner pinned layer 71. In this embodiment, the tunnel barrier layer 72 is made of a crystalline insulation material such as oxide of Mg (MgO) with a thickness of about 1 nm.

A high-polarizability film 73a and a soft magnetic film 73b are stacked on the tunnel barrier layer 72 in this order. The high-polarizability film 73a is made, for example, of CoFe with a thickness of approximately 1 nm, while the soft magnetic film 73b is made, for example, of NiFe with a thickness in a range from 2 nm to 6 nm. These films 73a and 73b form a magnetization free layer (free layer) 73 having a two-layered structure. Other than the above materials, the free layer 73 may be made of a ferromagnetic alloy material, such as Fe, Co, Ni, CoFe, NiFe, NiFeCo, CoFeB or cobalt iron nickel boron (CoFeNiB).

A cap layer 74 consisting of layers 74a and 74b is stacked on the free layer 73. The layer 74a is made, for example, of Ru with a thickness of approximately 1 nm, while the layer 74b is made, for example, of Ta with a thickness of approximately 5 nm. Other than the above materials, the cap layer 74 may be made of any of Rh, Pd, silver (Ag), iridium (Ir), Pt, gold (Au) and Mg, or an alloy of these.

The upper electrode layer 55 is stacked on the cap layer 74.

A hard bias layer 76 made of a hard magnetic material, such as CoCrPt is formed on the both sides of the TMR multi-layered structure in the track width direction through insulation layers 75 of for example $Al_2O_3$ or $SiO_2$. This hard bias layer 76 is used for applying a bias magnetic field for magnetic domain control to the free layer 73. In place of the hard bias layer, a stacked structure of a soft magnetic layer and an anti-ferromagnetic layer may be provided.

As explained above, in this embodiment, the tunnel barrier layer 72 is configured from a crystalline MgO, and the inner pinned layer 71 has a two-layered structure containing of the first magnetic layer 71a and the second magnetic layer 71b. Due to the two-layered structure of the inner pinned layer 71, it is possible to easily crystallize this inner pinned layer 71 without performing an annealing process at a high temperature of about 350° C. Namely, the first magnetic layer 71a of for example CoFeB is amorphous state just after the deposition, and the second magnetic layer 71b of for example CoFe is amorphous state or microcrystalline state if it has a thickness equal to or less than a certain value just after the deposition. Since the second magnetic layer 71b is made of an easily crystallized magnetic material and the crystalline tunnel barrier layer 72 is deposited thereon, this second magnetic layer 71b can be easily crystallized by a low-temperature annealing process without performing a high-temperature annealing process. Along with the crystallization of the second magnetic layer 71b, a part of or the entire first magnetic layer 71a is crystallized. Because the crystalline tunnel barrier layer 72 is used, an MR ratio of the TMR read head element increases. Furthermore, the inner pinned layer 71 has such two-layered structure, it is possible to more increase the MR ratio.

Figure 7:
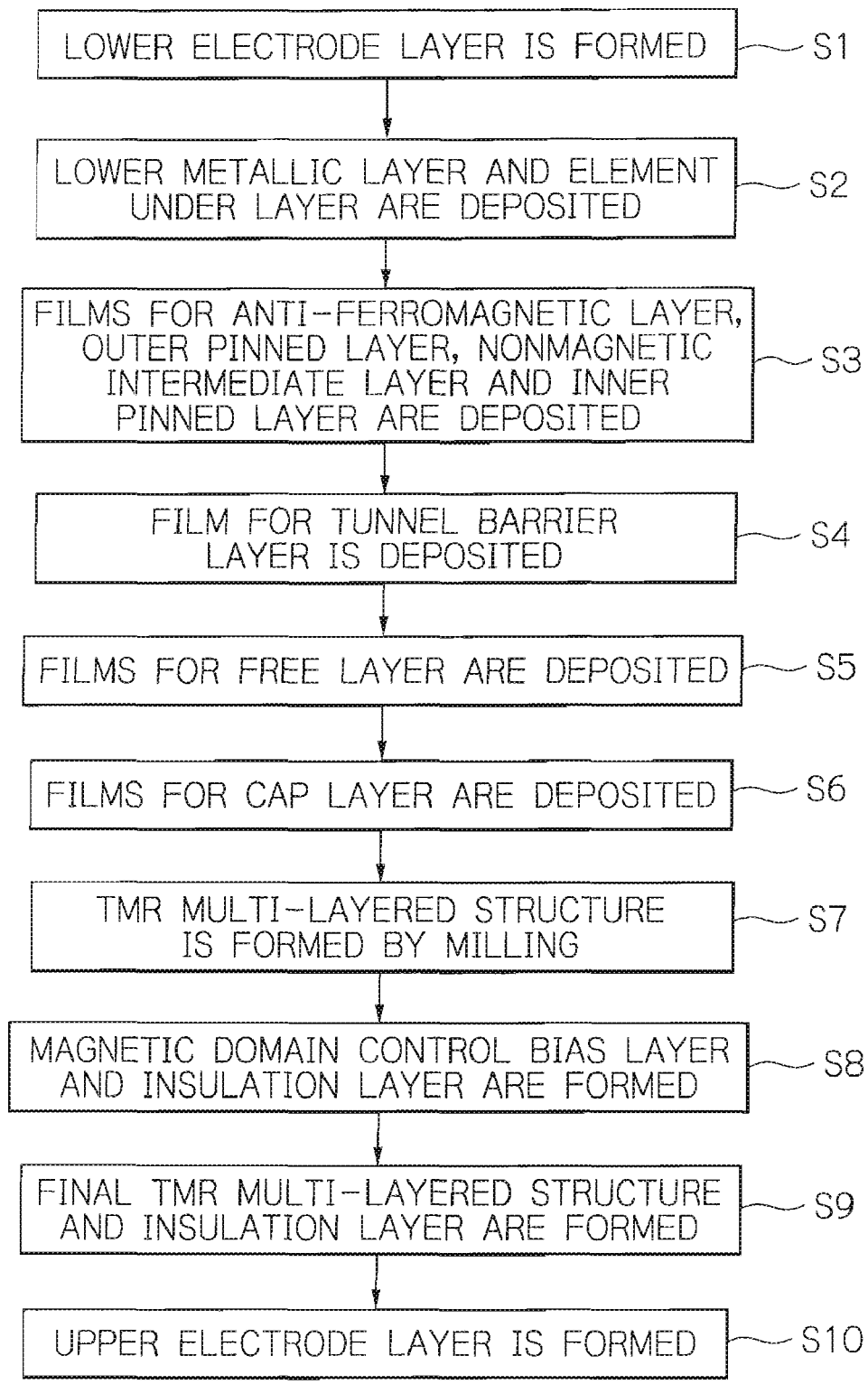
FIG. 7 is a flow chart illustrating a fabrication process of the TMR read head element in the embodiment of FIG. 1.

Hereinafter, a detailed description will be given of a fabrication process of the TMR read head element with reference to FIG. 7.

First, on the under insulation layer 51, the lower electrode layer 52 is formed by plating of metal magnetic material such as FeAlSi, NiFe, CoFe, NiFeCo, FeN, FeZrN, FeTaN, CoZrNb or CoZrTa with a thickness of about 0.1-3 µm, using a frame-plating method for example (Step S1).

Next, on the lower electrode 52, a film for the lower metallic layer 66 and a film for the element under-layer 67 are deposited in this order using a sputtering method for example (Step S2). The film for the lower metallic layer 66 is formed from, for example Ta, Hf, Nb, Zr, Ti, Mo or W with a thickness of about 0.5-5 nm. The film for the element under-layer 67 is formed from for example NiCr, NiFe, NiFeCr or Ru with a thickness of about 1-6 nm.

Further, a film for the anti-ferromagnetic layer 68, a film for the outer pinned layer 69, a film for the nonmagnetic intermediate layer 70, a film for the first magnetic layer 71a of the inner pinned layer 71 and a film for the second magnetic layer 71b of the inner pinned layer 71 are sequentially deposited in this order using a sputtering method for example (Step S3). The film for the anti-ferromagnetic layer 68 is formed from a Mn alloy such as, for example IrMn, PtMn, PdPtMn, FeMn, NiMn, RuRhMn, RhMn or CrMnPt with a thickness of about 5-15 nm, preferably about 7 nm. The film for the outer pinned layer 69 is formed from for example CoFe with a thickness of about 3 nm. The film for the nonmagnetic intermediate layer 70 is formed from for example Ru with a thickness of about 0.8 nm. The film for the first magnetic layer 71a of the inner pinned layer 71 is formed from for example CoFeB with a thickness of about 0.7 nm or more, preferably about 1.0 nm or more. The film for the second magnetic layer 71b of the inner pinned layer 71 is formed from for example CoFe or Co with a thickness of about 0.2 to 2.6 nm, preferably about 0.8 to 2.2 nm.

The film for the first magnetic layer 71a of the inner pinned layer 71, that is for example a CoFeB film, is amorphous just after the deposition, and its upper surface is flat with a low roughness. In case that the second magnetic layer 71b, that is for example a CoFe film, is deposited on this first magnetic layer 71a, because the amorphous CoFeB film is base, the CoFe film will grow, responding to this amorphous state of the base film, into approximate amorphous state, that is in amorphous state or microcrystalline state. Due to the flat surface of the amorphous CoFeB film, a flatness of an upper surface of the CoFe film deposited thereon improves. The CoFe film is made of an easily crystallized magnetic material and thus CoFe is amorphous state or microcrystalline state if it has a thickness equal to or less than a certain value just after the deposition. However, the crystalline tunnel barrier layer 72 is deposited thereon, this CoFe film can be easily crystallized to become a stabilization structure by a low-temperature annealing process without performing a high-temperature annealing process. As aforementioned, in order to crystallize the CoFe film that is the film for the second magnetic layer 71b by a low-temperature annealing process, it is important to keep the thickness of this CoFe film equal to or less than a certain value, desirably equal to or less than 2.6 nm, more desirably equal to or less than 2.2 nm.

Then, on the formed second magnetic layer 71b of the inner pinned layer 71, a film for the tunnel barrier layer 72 is deposited using a sputtering method for example (Step S4). This film for the tunnel barrier layer 72 is made of a crystalline insulation material such as for example oxide of Mg with a thickness of about 1 nm. Since the tunnel barrier layer 72 is deposited on the amorphous film (CoFe film) for the second magnetic layer 71b, which is formed on the first magnetic layer 71a and non-crystallized, energetically stable growth can be expected.

Then, on thus formed film for the tunnel barrier layer 72, a high polarization film 73a of CoFe for example with a thickness of about 1 nm, and a soft magnetic film 73b of NiFe for example with a thickness of about 2-6 nm are serially deposited, using a sputtering method for example, to form a film for the magnetization free layer 73 (Step S5). In modifications, the film for the free layer 73 may be made of a ferromagnetic alloy material such as for example Fe, Co, Ni, CoFe, NiFe, NiFeCo, CoFeB or CoFeNiB.

Then, on the film for the free layer 73, a film for the cap layer 74 is deposited, using a sputtering method for example (Step S6). The film for the cap layer 74 is formed from a film 74a of Ru for example with a thickness of about 1 nm and a film 74b of Ta for example with a thickness of about 5 nm. In modifications, the film for the cap layer 74 may be made of Rh, Pd, Ag, Ir, Pt, Au or Mg, or of an alloy of them. According to the above processes, TMR multi-layered films are formed.

Then, a TMR multi-layered structure 53 shown in FIG. 5 is formed by ion beam etching of the TMR multi-layered films (Step S7). This etching process is performed for example by forming, on the TMR multi-layered films, a resist mask with a pattern for liftoff, and then by applying ion beam of Ar ions for example through the resist mask to the TMR multi-layered films.

After formation of the TMR multi-layered structure 53, an insulation layer 75 of for example $Al_2O_3$ or $SiO_2$ with a thickness of about 3-20 nm, a bias undercoat layer of for example Ta, Ru, Hf, Nb, Zr, Ti, Mo, Cr or W, and a bias layer of for example CoFe, NiFe, CoPt or CoCrPt are serially deposited in this order, using sputtering or ion beam sputtering method for example. Thereafter, the resist is removed by the liftoff to form a magnetic domain control bias layer 76 (Step S8).

Then, the TMR multi-layered structure 53 is further patterned using a photolithography method for example to obtain a final TMR multi-layered structure 53, and subsequently an insulation layer 54 is deposited using a sputtering method or an ion beam sputtering method for example (Step S9).

Thereafter, on the insulation layer 54 and the TMR multi-layered structure 53, an upper electrode layer 55 used also as an upper electrode layer (SS1) of metal magnetic material such as FeAlSi, NiFe, CoFe, NiFeCo, FeN, FeZrN, FeTaN, CoZrNb or CoZrTa, or a multi-layered film containing these materials with a thickness of about 0.5-3 µm is formed, using a frame-plating method for example (Step S10). According to the above-mentioned processes, formation of the TMR read head is completed.

Desirable configurations of the inner pinned layer 71 and the outer pinned layer 69 when the tunnel barrier layer 72 is formed from the crystalline insulation material of MgO were considered.

First, advantages resulting from that the inner pinned layer 72 is formed in the two-layered structure of the crystalline first magnetic layer 71a and the crystalline second magnetic layer 71b were confirmed Samples each having an inner pinned layer in a single-layered structure of 80(CoFe)20B (CoFeB with content of CoFe is 80 at % and content of B is 20 at %) and samples each having an inner pinned layer in a two-layered structure of a first magnetic layer of 80(CoFe)20B (CoFeB with content of CoFe is 80 at % and content of B is 20 at %) and a second magnetic layer of 90Co10Fe (CoFe with content of Co is 90 at % and content of Fe is 10 at %) were prepared by varying the Co—Fe composition ratio (content of Co (at %)) in the CoFeB layer, and then an MR ratio of each sample was measured.

Figure 8:
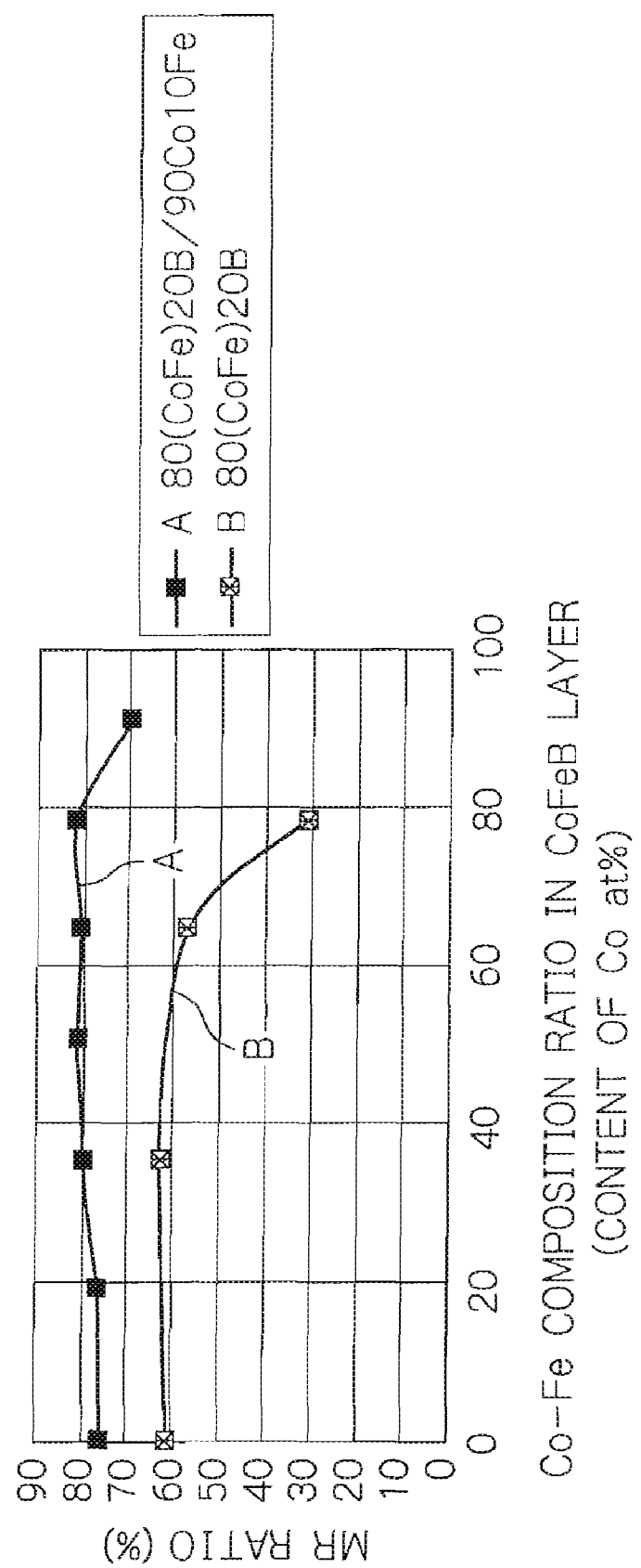
FIG. 8 is a characteristic diagram illustrating characteristics of an MR ratio with respect to a Co—Fe composition ratio in a first ferromagnetic layer (CoFeB)

FIG. 8 illustrates characteristics of an MR ratio with respect to a Co—Fe composition ratio (content of Co (at %)) in the CoFeB layers of samples A and B. The sample A has an inner pinned layer of a two-layered structure of CoFeB/CoFe, and the sample B has an inner pinned layer of a single-layered structure of CoFeB. When forming these samples, the annealing temperature was kept at 300° C. or less.

It will be noted from the figure that the TMR element with the two-layered inner pinned layer of CoFeB/CoFe provides an extremely higher MR ratio than the TMR element with the single-layered inner pinned layer of CoFeB. Also, it will be understood from the figure, resulting from the two-layered structure of the inner pinned layer, the dependence of the MR ratio of the CoFeB layer on Co—Fe composition decreases and the Co—Fe composition at which the MR ratio insures its maximum value shifts to Co-richer side. The latter tendency of the two-layered inner pinned layer where the maximum value of the MR ratio stays in Co-richer side is particularly effective in the case that the inner pinned layer and the outer pinned layer are coupled through the nonmagnetic intermediate layer of Ru because the degree of synthetic coupling through the nonmagnetic intermediate layer of Ru reduces at Fe-richer side in the CoFeB layer.

Next, the dependence of the MR ratio on thickness of each layer of the inner pinned layer is considered.

Samples each having an anti-ferromagnetic layer of IrMn, an outer pinned layer 69, a nonmagnetic intermediate layer 70 of Ru, an inner pinned layer consisting of a first magnetic layer 71a of CoFeB and a second magnetic layer 71b of CoFe or FeNi, a tunnel barrier layer 72 of MgO, a free layer 73 and a cap layer 74 stacked in this order on an element under-layer 67. The first magnetic layers 71a of CoFeB in the respective samples have different thickness values.

Figure 9:
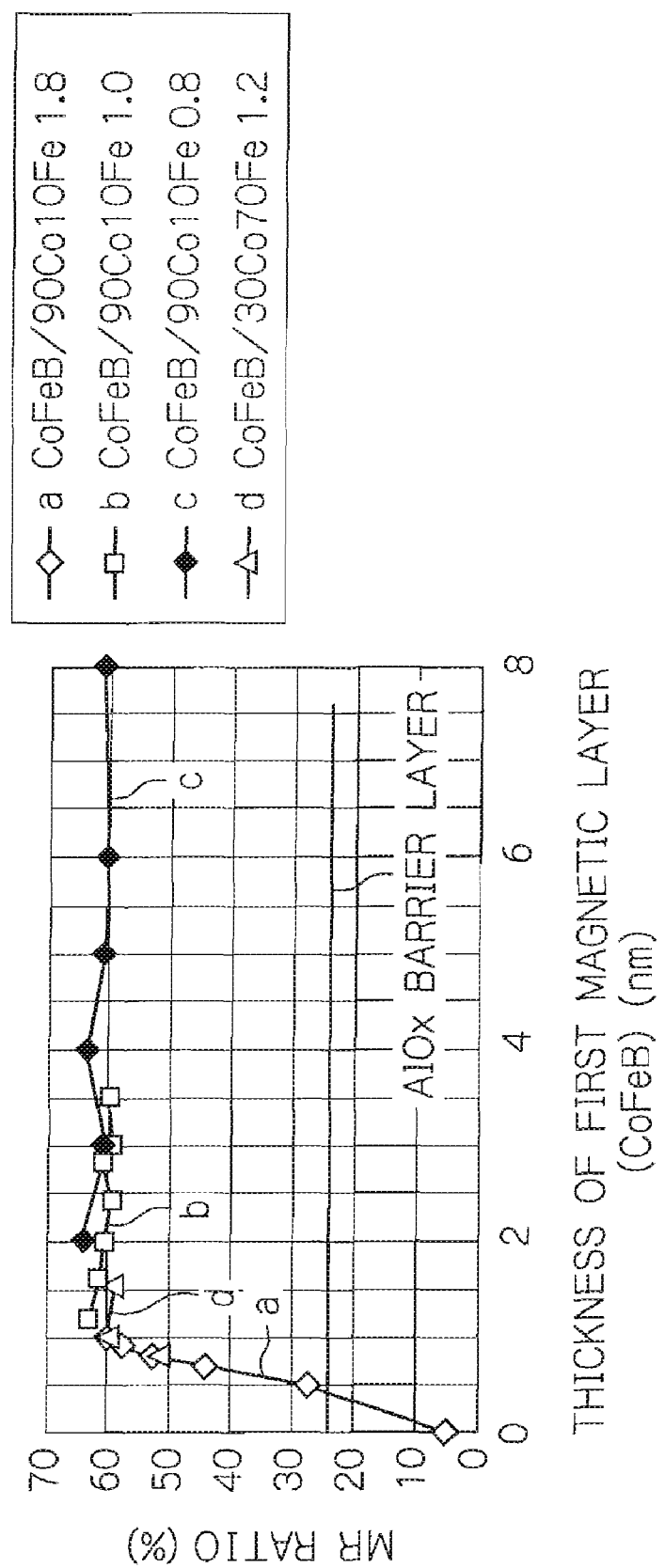
FIG. 9 is a characteristic diagram illustrating characteristics of an MR ratio with respect to a thickness of the first ferromagnetic layer (CoFeB)

FIG. 9 illustrates characteristics of an MR ratio with respect to a thickness of the first magnetic layers 71a of CoFeB in the inner pinned layers. The sample a has the first magnetic layer 71a with composition of 62Co18Fe20B (content of Co is 62 at %, content of Fe is 18 at % and content of B is 20 at %), and the second magnetic layer 71b with composition of 90Co10Fe (content of Co is 90 at % and content of Fe is 10 at %) and with a thickness of 1.8 nm. The sample b has the first magnetic layer 71a with composition of 62Co18Fe20B (content of Co is 62 at %, content of Fe is 18 at % and content of B is 20 at %), and the second magnetic layer 71b with composition of 90Co10Fe (content of Co is 90 at % and content of Fe is 10 at %) and with a thickness of 1.0 nm. The sample c has the first magnetic layer 71a with composition of 62Co18Fe20B (content of Co is 62 at %, content of Fe is 18 at % and content of B is 20 at %), and the second magnetic layer 71b with composition of 90Co10Fe (content of Co is 90 at % and content of Fe is 10 at %) and with a thickness of 0.8 nm. The sample d has the first magnetic layer 71a with composition of 62Co18Fe20B (content of Co is 62 at %, content of Fe is 18 at % and content of B is 20 at %), and the second magnetic layer 71b with composition of 30Co70Fe (content of Co is 30 at % and content of Fe is 70 at %) and with a thickness of 1.2 nm.

As will be noted from the figure, it is desired that the thickness of the first magnetic layer 71a of the inner pinned layer is 0.5 nm or more because an MR ratio higher than that when the tunnel barrier layer is made of an Al oxide (AlOx) that is an amorphous oxide can be obtained. Also, more desirably, the thickness of the first magnetic layer 71a is 1.0 nm or more in order to obtain a sufficiently stable high MR ratio.

Figure 10:
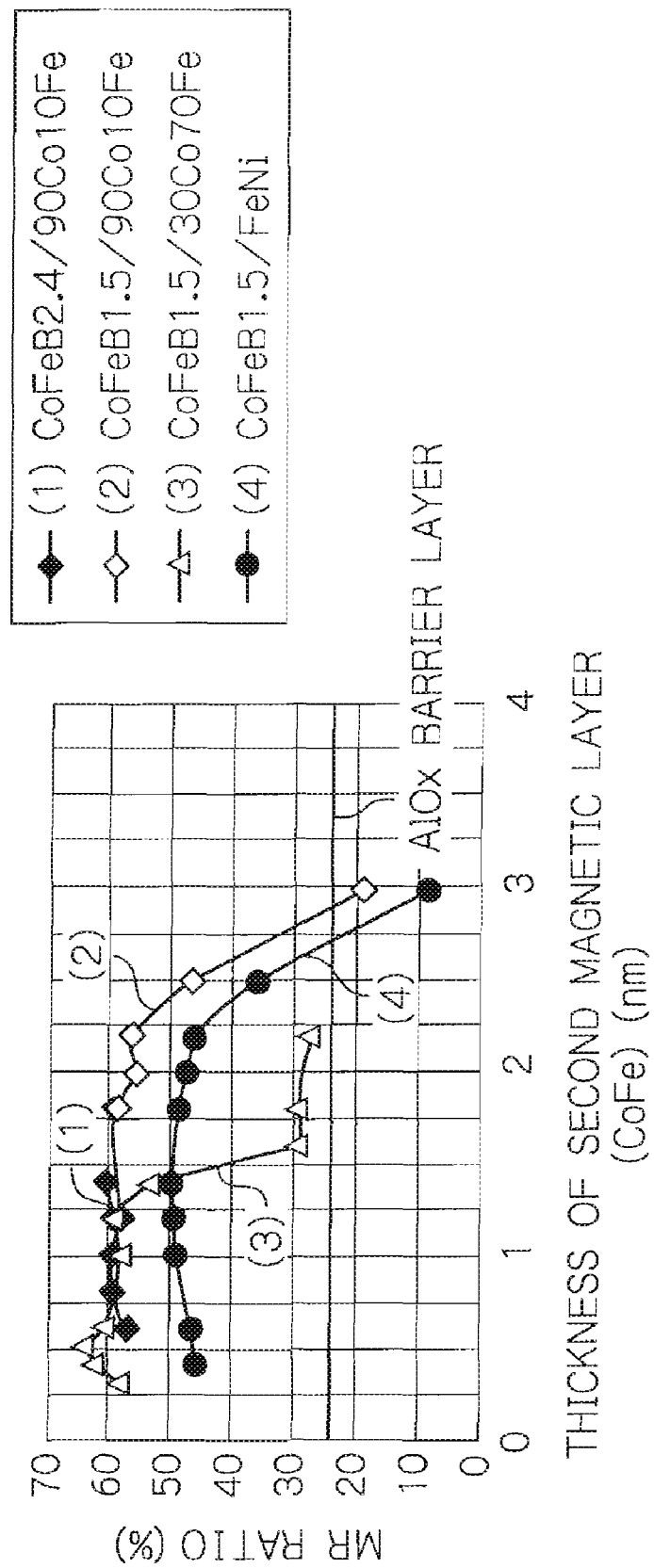
FIG. 10 is a characteristic diagram illustrating characteristics of an MR ratio with respect to a thickness of a second ferromagnetic layer (CoFe, FeNi)

FIG. 10 illustrates characteristics of an MR ratio with respect to a thickness of the second magnetic layers 71b of CoFe or FeNi in the inner pinned layers. The sample (1) has the first magnetic layer 71a with composition of 62Co18Fe20B (content of Co is 62 at %, content of Fe is 18 at % and content of B is 20 at %) and with a thickness of 2.4 nm, and the second magnetic layer 71b with composition of 90Co10Fe (content of Co is 90 at % and content of Fe is 10 at %). The sample (2) has the first magnetic layer 71a with composition of 62Co18Fe20B (content of Co is 62 at %, content of Fe is 18 at % and content of B is 20 at %) and with a thickness of 1.5 nm, and the second magnetic layer 71b with composition of 90Co10Fe (content of Co is 90 at % and content of Fe is 10 at %). The sample (3) has the first magnetic layer 71a with composition of 62Co18Fe20B (content of Co is 62 at %, content of Fe is 18 at % and content of B is 20 at %) and with a thickness of 1.5 nm, and the second magnetic layer 71b with composition of 30Co70Fe (content of Co is 30 at % and content of Fe is 70 at %). The sample (4) has the first magnetic layer 71a with composition of 62Co18Fe20B (content of Co is 62 at %, content of Fe is 18 at % and content of B is 20 at %) and with a thickness of 1.5 nm, and the second magnetic layer 71b with composition of 34Ni66Fe (content of Ni is 34 at % and content of Fe is 66 at %).

As will be noted from the figure, it is desired that the thickness of the second magnetic layer 71b of the inner pinned layer is 2.9 nm or less in case that its composition is 90Co10Fe because an MR ratio higher than that when the tunnel barrier layer is made of an Al oxide (AlOx) that is an amorphous oxide can be obtained. The thickness of the second magnetic layer 71b is 0.2 nm or more due to the actual technical limitation of deposition. Also, more desirably, the thickness of the second magnetic layer 71b of 90Co10Fe is 0.8 nm to 1.8 nm in order to obtain a sufficiently stable high MR ratio.

In case that the composition of the second magnetic layer 71b of the inner pinned layer is 30Co70Fe, it is desired that the thickness of the second magnetic layer 71b is 1.5 nm or less because an MR ratio higher than that when the tunnel barrier layer is made of an Al oxide (AlOx) that is an amorphous oxide can be obtained. The thickness of the second magnetic layer 71b is 0.2 nm or more due to the actual technical limitation of deposition. Also, more desirably, the thickness of the second magnetic layer 71b of 30Co70Fe is 0.4 nm to 1.2 nm in order to obtain a sufficiently stable high MR ratio.

In case that the composition of the second magnetic layer 71b of the inner pinned layer is 34Ni66Fe, it is desired that the thickness of the second magnetic layer 71b is 2.7 nm or less because an MR ratio higher than that when the tunnel barrier layer is made of an Al oxide (AlOx) that is an amorphous oxide can be obtained. The thickness of the second magnetic layer 71b is 0.2 nm or more due to the actual technical limitation of deposition. Also, more desirably, the thickness of the second magnetic layer 71b of 34Ni66Fe is 0.8 nm to 1.8 nm because the MR ratio is saturated.

Next, the relationship between a saturated magnetization per unit area (saturated magnetization×thickness) Mst of each of the outer pinned layer 69 and the inner pinned layer 71 and a thickness of the first magnetic layer 71a of the inner pinned layer 71 is considered.

If a saturated magnetization per unit area Mst of the outer pinned layer 69 is larger than that of the inner pinned layer 71, resistance against external magnetic field improves. In case that composition of the outer pinned layer 69 is 70Co30Fe and a thickness thereof is 3.0 nm, a saturated magnetization per unit area Mst of the outer pinned layer 69 becomes Mst=1670 emu/cm$^2$×3 nm=5.0E−4 emu/cm$^2$.

Figure 11:
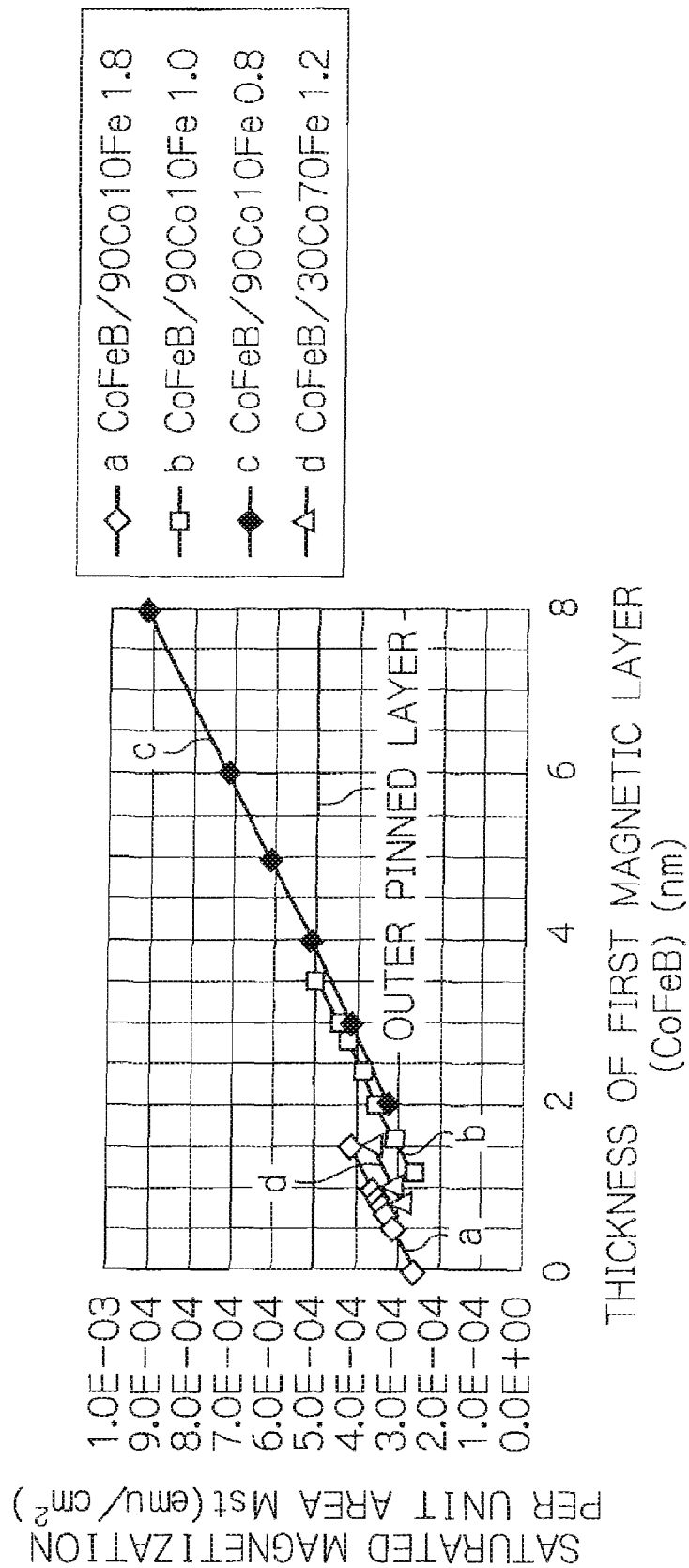
FIG. 11 is a characteristic diagram illustrating characteristics of a saturated magnetization per unit area Mst with respect to a thickness of a first ferromagnetic layer (CoFeB).

FIG. 11 illustrates characteristics of a saturated magnetization per unit area Mst with respect to a thickness of the first ferromagnetic layer (CoFeB) 71a of the inner pinned layer. The sample a has the first magnetic layer 71a with composition of 62Co18Fe20B (content of Co is 62 at %, content of Fe is 18 at % and content of B is 20 at %), and the second magnetic layer 71b with composition of 90Co10Fe (content of Co is 90 at % and content of Fe is 10 at %) and with a thickness of 1.8 nm. The sample b has the first magnetic layer 71a with composition of 62Co18Fe20B (content of Co is 62 at %, content of Fe is 18 at % and content of B is 20 at %), and the second magnetic layer 71b with composition of 90Co10Fe (content of Co is 90 at % and content of Fe is 10 at %) and with a thickness of 1.0 nm. The sample c has the first magnetic layer 71a with composition of 62Co18Fe20B (content of Co is 62 at %, content of Fe is 18 at % and content of B is 20 at %), and the second magnetic layer 71b with composition of 90Co10Fe (content of Co is 90 at % and content of Fe is 10 at %) and with a thickness of 0.8 nm. The sample d has the first magnetic layer 71a with composition of 62Co18Fe20B (content of Co is 62 at %, content of Fe is 18 at % and content of B is 20 at %), and the second magnetic layer 71b with composition of 30Co70Fe (content of Co is 30 at % and content of Fe is 70 at %) and with a thickness of 1.2 nm.

As will be noted from the figure, it is necessary to determine a thickness of the first magnetic layer 71a of the inner pinned layer 71 less than 3.9 nm in order to make the saturated magnetization per unit area Mst of the outer pinned layer 69 larger than that of the inner pinned layer 71.

The aforementioned embodiment concerns a manufacturing method of a thin-film magnetic head with a TMR read head element. The present invention is similarly applicable to a manufacturing method of a magnetic memory such as an MRAM cell. As is known, each MRAM cell has a TMR structure with a magnetization-fixed layer, a tunnel barrier layer, a magnetization-free layer and an upper conductive layer acting as a word line serially stacked on a lower conductive layer acting as a bit line.

Many widely different embodiments of the present invention may be constructed without departing from the spirit and scope of the present invention. It should be understood that the present invention is not limited to the specific embodiments described in the specification, except as defined in the appended claims.

The invention claimed is:

1. A tunnel magnetoresistive effect element comprising:
a lower magnetic layer;
an upper magnetic layer; and
a tunnel barrier layer of a crystalline insulation material sandwiched between said lower magnetic layer and said upper magnetic layer,
said lower magnetic layer including a first magnetic layer and a second magnetic layer sandwiched between said first magnetic layer and said tunnel barrier layer, said second magnetic layer being formed from a magnetic material containing at least one of iron, cobalt and nickel and having a thickness of 0.2 to 2.9 nm.

2. The tunnel magnetoresistive effect element as claimed in claim 1, wherein said second magnetic layer is formed from a magnetic material, a part of or all of which is crystalline.

3. The tunnel magnetoresistive effect element as claimed in claim 1, wherein said first magnetic layer is formed from a magnetic material, a part of or all of which is crystalline.

4. The tunnel magnetoresistive effect element as claimed in claim 1, wherein said first magnetic layer is formed from a magnetic material that contains as a main component at least one of iron, cobalt and nickel, and further contains at least one of boron, zirconium, hafnium, silicon, tantalum, molybdenum, niobium, palladium and titanium.

5. The tunnel magnetoresistive effect element as claimed in claim 1, wherein said first magnetic layer has a thickness of 0.7 nm or more.

6. The tunnel magnetoresistive effect element as claimed in claim 1, wherein said first magnetic layer has a thickness of 1.0 nm or more.

7. The tunnel magnetoresistive effect element as claimed in claim 1, wherein said second magnetic layer has a thickness of 0.4 to 1.8 nm.

8. The tunnel magnetoresistive effect element as claimed in claim 1, wherein said tunnel barrier layer is formed from a crystalline insulation material of magnesium oxide.

9. The tunnel magnetoresistive effect element as claimed in claim 1, wherein said lower magnetic layer is a magnetization-fixed layer comprising an anti-ferromagnetic layer, an outer pinned layer stacked on said anti-ferromagnetic layer, a nonmagnetic intermediate layer stacked on said outer pinned layer, and an inner pinned layer consisting of said first magnetic layer and said second magnetic layer, stacked on said nonmagnetic intermediate layer, and wherein said upper magnetic layer is a magnetization-free layer.

10. The tunnel magnetoresistive effect element as claimed in claim 9, wherein a saturated magnetization per unit area of said outer pinned layer is larger than a saturated magnetization per unit area of said inner pinned layer.

11. A thin-film magnetic head with a tunnel magnetoresistive effect element, said tunnel magnetoresistive effect element comprising:
a lower magnetic layer;
an upper magnetic layer; and
a tunnel barrier layer of a crystalline insulation material sandwiched between said lower magnetic layer and said upper magnetic layer,
said lower magnetic layer including a first magnetic layer and a second magnetic layer sandwiched between said first magnetic layer and said tunnel barrier layer, said second magnetic layer being formed from a magnetic material containing at least one of iron, cobalt and nickel and having a thickness of 0.2 to 2.9 nm.

12. A magnetic head assembly having a thin-film magnetic head with a tunnel magnetoresistive effect element, and a support member for supporting said thin-film magnetic head, said tunnel magnetoresistive effect element comprising:
a lower magnetic layer;
an upper magnetic layer; and
a tunnel barrier layer of a crystalline insulation material sandwiched between said lower magnetic layer and said upper magnetic layer,
said lower magnetic layer including a first magnetic layer and a second magnetic layer sandwiched between said first magnetic layer and said tunnel barrier layer, said second magnetic layer being formed from a magnetic material containing at least one of iron, cobalt and nickel and having a thickness of 0.2 to 2.9 nm.

13. A magnetic disk drive apparatus having at least one magnetic disk and at least one magnetic head assembly, each magnetic head assembly having a thin-film magnetic head with a tunnel magnetoresistive effect element, and a support member for supporting said thin-film magnetic head, said tunnel magnetoresistive effect element comprising:
 a lower magnetic layer;
 an upper magnetic layer; and
 a tunnel barrier layer of a crystalline insulation material sandwiched between said lower magnetic layer and said upper magnetic layer,
 said lower magnetic layer including a first magnetic layer and a second magnetic layer sandwiched between said first magnetic layer and said tunnel barrier layer, said second magnetic layer being formed from a magnetic material containing at least one of iron, cobalt and nickel and having a thickness of 0.2 to 2.9 nm.

14. A magnetic memory with a tunnel magnetoresistive effect element, said tunnel magnetoresistive effect element comprising:
 a lower magnetic layer;
 an upper magnetic layer; and
 a tunnel barrier layer of a crystalline insulation material sandwiched between said lower magnetic layer and said upper magnetic layer,
 said lower magnetic layer including a first magnetic layer and a second magnetic layer sandwiched between said first magnetic layer and said tunnel barrier layer, said second magnetic layer being formed from a magnetic material containing at least one of iron, cobalt and nickel and having a thickness of 0.2 to 2.9 nm.

15. A manufacturing method of a tunnel magnetoresistive effect element, comprising the steps of:
 forming a magnetization-fixed layer;
 forming a tunnel barrier layer on said magnetization-fixed layer; and
 forming a magnetization-free layer on said tunnel barrier layer,
 said forming step of the magnetization-fixed layer comprising stacking sequentially a first magnetic layer and a second magnetic layer formed from a magnetic material containing at least one of iron, cobalt and nickel, said second magnetic layer being deposited to have a thickness of 0.2 to 2.9 nm,
 said forming step of the tunnel barrier layer comprising stacking on said second magnetic layer the tunnel barrier layer of a crystalline insulation material.

16. The manufacturing method as claimed in claim 15, wherein the stacking of said second magnetic layer comprises depositing a magnetic material that is easily crystallized.

17. The manufacturing method as claimed in claim 15, wherein the stacking of said first magnetic layer comprises depositing a magnetic material that is amorphous at least at deposition.

18. The manufacturing method as claimed in claim 15, wherein said method further comprises a step of performing a low-temperature annealing after the forming of said tunnel barrier layer in order to crystallize a part of or all of said first magnetic layer and said second magnetic layer.

19. The manufacturing method as claimed in claim 15, wherein the stacking of said first magnetic layer comprises depositing a magnetic material that contains as a main component at least one of iron, cobalt and nickel, and further contains at least one of boron, zirconium, hafnium, silicon, tantalum, molybdenum, niobium, palladium and titanium.

20. The manufacturing method as claimed in claim 15, wherein the stacking of said first magnetic layer comprises depositing the first magnetic layer to have a thickness of 0.7 nm or more.

21. The manufacturing method as claimed in claim 15, wherein the stacking of said first magnetic layer comprises depositing the first magnetic layer to have a thickness of 1.0 nm or more.

22. The manufacturing method as claimed in claim 15, wherein the stacking of said second magnetic layer comprises depositing the second magnetic layer to have a thickness of 0.4 to 1.8 nm.

23. The manufacturing method as claimed in claim 15, wherein the stacking of said tunnel barrier layer comprises depositing a crystalline insulation material of magnesium oxide.

24. The manufacturing method as claimed in claim 15, wherein said forming step of the magnetization-fixed layer comprises stacking sequentially an anti-ferromagnetic layer, an outer pinned layer, a nonmagnetic intermediate layer and an inner pinned layer consisting of said first magnetic layer and said second magnetic layer, in this order.

25. The manufacturing method as claimed in claim 24, wherein the stacking of said outer pinned layer and said inner pinned layer is performed such that a saturated magnetization per unit area of said outer pinned layer is larger than a saturated magnetization per unit area of said inner pinned layer.

* * * * *